(12) United States Patent
Lee

(10) Patent No.: US 9,859,884 B2
(45) Date of Patent: Jan. 2, 2018

(54) SEMICONDUCTOR APPARATUS

(71) Applicant: SK hynix Inc., Icheon-si, Gyeonggi-do (KR)

(72) Inventor: Kwang Hun Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 31 days.

(21) Appl. No.: 15/167,164

(22) Filed: May 27, 2016

(65) Prior Publication Data

US 2017/0187370 A1 Jun. 29, 2017

(30) Foreign Application Priority Data

Dec. 28, 2015 (KR) .................. 10-2015-0187669

(51) Int. Cl.
| | |
|---|---|
| *H03K 17/16* | (2006.01) |
| *H03K 5/04* | (2006.01) |
| *H04L 1/00* | (2006.01) |

(52) U.S. Cl.
CPC ............ *H03K 17/162* (2013.01); *H03K 5/04* (2013.01); *H04L 1/00* (2013.01)

(58) Field of Classification Search
USPC ..................................... 327/387; 365/93, 94
See application file for complete search history.

(56) References Cited

U.S. PATENT DOCUMENTS

| | | | | |
|---|---|---|---|---|
| 6,292,410 | B1* | 9/2001 | Yi ..................... | G11C 7/1051 365/189.05 |
| 6,618,457 | B1* | 9/2003 | Yi ..................... | G11C 7/1078 375/354 |
| 9,679,633 | B2* | 6/2017 | Maryan ............... | G11C 11/4076 |
| 2002/0167339 | A1* | 11/2002 | Chang .............. | H03K 19/01855 326/112 |
| 2002/0174373 | A1* | 11/2002 | Chang ................ | H04L 67/1095 713/400 |
| 2003/0090294 | A1* | 5/2003 | Chang ................. | G11C 7/1078 326/93 |
| 2004/0124893 | A1* | 7/2004 | Falconer ................. | H03L 7/00 327/141 |
| 2006/0203575 | A1* | 9/2006 | Han ..................... | G11C 7/1078 365/194 |
| 2009/0190410 | A1* | 7/2009 | Faue .................... | G11C 7/1078 365/189.05 |
| 2012/0250423 | A1* | 10/2012 | Koyanagi ...... | H03K 19/017527 365/189.05 |

(Continued)

FOREIGN PATENT DOCUMENTS

KR 1020100074384 A 7/2010

*Primary Examiner* — Adam Houston
(74) *Attorney, Agent, or Firm* — William Park & Associates Ltd.

(57) ABSTRACT

A semiconductor apparatus may include a noise determination circuit, a strobe signal control circuit, and a reception circuit. The noise determination circuit may sense and determine noise of a reference voltage, and generate an up control signal and a down control signal. The strobe signal control circuit may adjust a transition timing of a strobe signal in response to the up control signal and the down control signal, and output a control strobe signal. The reception circuit may generate internal data signal in response to external data signal, the reference voltage, and the control strobe signal.

19 Claims, 5 Drawing Sheets

(56) References Cited

U.S. PATENT DOCUMENTS

2014/0269117 A1* 9/2014 Maryan ................ G11C 7/1087
365/193
2016/0149565 A1* 5/2016 Ye .......................... H03K 5/133
327/244
2017/0187370 A1* 6/2017 Lee ......................... H03K 5/04

* cited by examiner

SEMICONDUCTOR APPARATUS

CROSS-REFERENCES TO RELATED APPLICATION

The present application claims priority under 35 U.S.C. §119(a) to Korean application number 10-2015-0187669 filed on Dec. 28, 2015, in the Korean Intellectual Property Office, which is incorporated herein by reference in its entirety.

BACKGROUND

1. Technical Field

Various embodiments generally relate to a semiconductor integrated circuit, and, more particularly, to a semiconductor apparatus.

2. Related Art

A semiconductor apparatus transmits/receives signals to/from an external device to which the semiconductor apparatus is coupled.

Accordingly, the semiconductor apparatus may include a circuit that can be used for quickly and precisely transmitting/receiving signals to/from the external device.

SUMMARY

In an embodiment, a semiconductor apparatus may include a noise determination, a strobe signal control circuit, and a reception circuit. The noise determination circuit may sense and determine noise of a reference voltage, and generate an up control signal and a down control signal. The strobe signal control circuit may adjust a transition timing of a strobe signal in response to the up control signal and the down control signal, and output a control strobe signal. The reception circuit may generate internal data signal in response to external data signal, the reference voltage, and the control strobe signal.

In an embodiment, a semiconductor apparatus may include a noise determination circuit, a strobe signal control circuit, a first reception circuit, and a second reception circuit. The noise determination circuit may generate an up control signal and a down control signal in response to a reference voltage, a first determination voltage, and a second determination voltage. The strobe signal control circuit may adjust a transition timing of a strobe signal in response to the up control signal and the down control signal, and output a control strobe signal. The first reception circuit may compare external data signal with a voltage level of the reference voltage when the control strobe signal is enabled, and generate first internal data signal. The second reception circuit may compare the external data signal with a voltage level of the reference voltage when a strobe bar signal is enabled, and generate second internal data signal.

In an embodiment, a semiconductor apparatus may include a noise determination circuit, a first strobe signal control circuit, a second strobe signal control circuit, a first reception circuit, and a second reception circuit. The noise determination circuit may disable both an up control signal and a down control signal or enable one of the up control signal and the down control signal based on whether a voltage level change in a reference voltage is between a first determination voltage and a second determination voltage or the voltage level change in the reference voltage is equal to or higher than the first determination voltage or equal to or lower than the second determination voltage. The first strobe signal control circuit may output a strobe signal, as a control strobe signal, in response to the up control signal and the down control signal. The second strobe signal control circuit may output a strobe bar signal, as a control strobe bar signal, in response to the up control signal and the down control signal. The first reception circuit may compare external data signal with a voltage level of the reference voltage in response to the control strobe signal, and generate first internal data signal. The second reception circuit may compare the external data signal with a voltage level of the reference voltage in response to the control strobe bar signal, and generate second internal data signal.

DETAILED DESCRIPTION

Hereinafter, a semiconductor apparatus thereof will be described below with reference to the accompanying drawings through various examples of embodiments.

Figure 1:
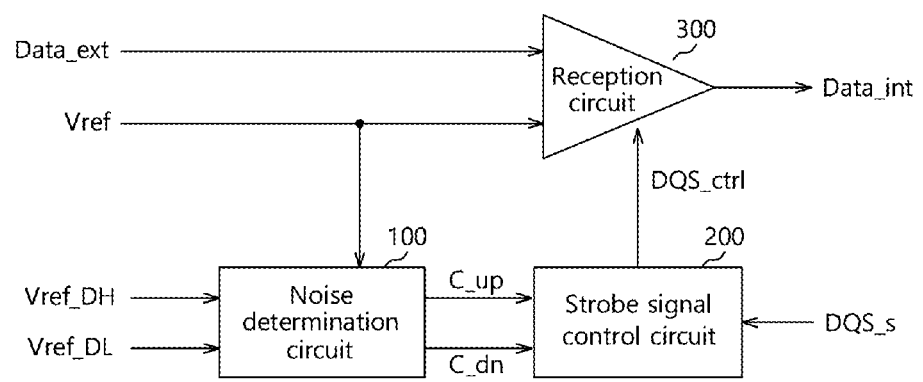
FIG. 1 is a diagram illustrating an example of a semiconductor apparatus in accordance with an embodiment.

In FIG. 1, a semiconductor apparatus in accordance with an embodiment may include a noise determination circuit 100, a strobe signal control circuit 200, and a reception circuit 300.

The noise determination circuit 100 may sense and determine noise of a reference voltage Vref, and generate an up control signal C_up and a down control signal C_dn. For example, the noise determination circuit 100 may enable the up control signal C_up when a voltage level of the reference voltage Vref is equal to or higher than a first predetermined voltage level, and may enable the down control signal C_dn when a voltage level of the reference voltage Vref is equal to or lower than a second predetermined voltage level. For example, the noise determination circuit 100 may enable the up control signal C_up when the reference voltage Vref is equal to or higher than the voltage level of a first determination voltage Vref_DH. The noise determination circuit 100 may enable the down control signal C_dn when the reference voltage Vref is equal to or lower than the voltage level of a second determination voltage Vref_DL. The first determination voltage Vref_DH has the voltage level higher than the voltage level of the reference voltage Vref, and the second determination voltage Vref_DL has the voltage level lower than the voltage level of the reference voltage Vref.

A signal edge is a transition in a digital signal either from a logic low to a logic high or from the logic high to the logic low. A rising edge is the transition from the logic low to the logic high, and a falling edge is the transition from the logic high to the logic low. The strobe signal control circuit 200 may adjust one or both of a rising-edge timing and a falling-edge timing of a strobe signal DQS_s in response to the up control signal C_up and the down control signal C_dn, and output a control strobe signal DQS_ctrl. For example, the strobe signal control circuit 200 may output the strobe signal DQS_s, as the control strobe signal DQS_ctrl, when both the up control signal C_up and the down control signal C_dn are disabled. The strobe signal control circuit 200 may adjust the rising-edge timing of the strobe signal DQS_s when the up control signal C_up is enabled, and output the control strobe signal DQS_ctrl accordingly. The strobe signal control circuit 200 may adjust the falling-edge timing of the strobe signal DQS_s when the down control signal C_dn is enabled, and output the control strobe signal DQS_ctrl accordingly. In detail, the strobe signal control circuit 200 may shift a rising-edge of the strobe signal DQS_s to an earlier point in time when the up control signal C_up is enabled. For example, the strobe signal control circuit 200 may increase a slew rate of the strobe signal DQS_s at its rising edge. The strobe signal control circuit 200 may shift a falling-edge of the strobe signal DQS_s to an earlier point in time when the down control signal C_dn is enabled. For example, the strobe signal control circuit 200 may increase a slew rate of the strobe signal DQS_s at its falling edge.

The reception circuit 300 may generate internal data signal Data_int in response to the control strobe signal DQS_ctrl and external data Data_ext. For example, the reception circuit 300 may generate the internal data signal Data_int by comparing the external data signal Data_ext with a voltage level of the reference voltage Vref during a period when the control strobe signal DQS_ctrl is enabled.

Figure 2:
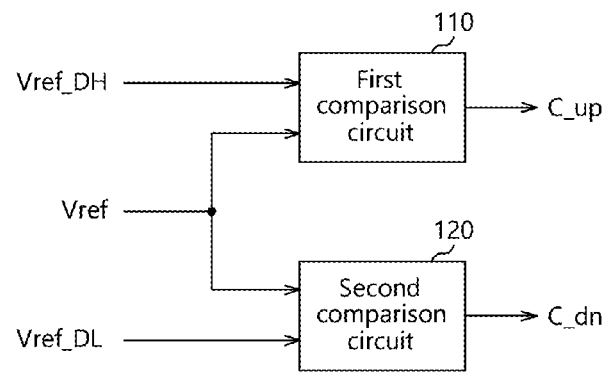
FIG. 2 is a diagram illustrating an example of the noise determination circuit shown in FIG. 1.

In FIG. 2, the noise determination circuit 100 may include first and second comparison circuits 110 and 120.

The first comparison circuit 110 may generate the up control signal C_up in response to the first determination voltage Vref_DH and the reference voltage Vref. For example, the first comparison circuit 110 may enable the up control signal C_up when a voltage level of the reference voltage Vref is higher than the voltage level of the first determination voltage Vref_DH. The first comparison circuit 110 may disable the up control signal C_up when a voltage level of the reference voltage Vref is lower than the voltage level of the first determination voltage Vref_DH.

The second comparison circuit 120 may generate the down control signal C_dn in response to the second determination voltage Vref_DL and the reference voltage Vref. For example, the second comparison circuit 120 may enable the down control signal C_dn when a voltage level of the reference voltage Vref is lower than the voltage level of the second determination voltage Vref_DL. The second comparison circuit 120 may disable the down control signal C_dn when a voltage level of the reference voltage Vref is higher than the voltage level of the second determination voltage Vref_DL.

Figure 3:
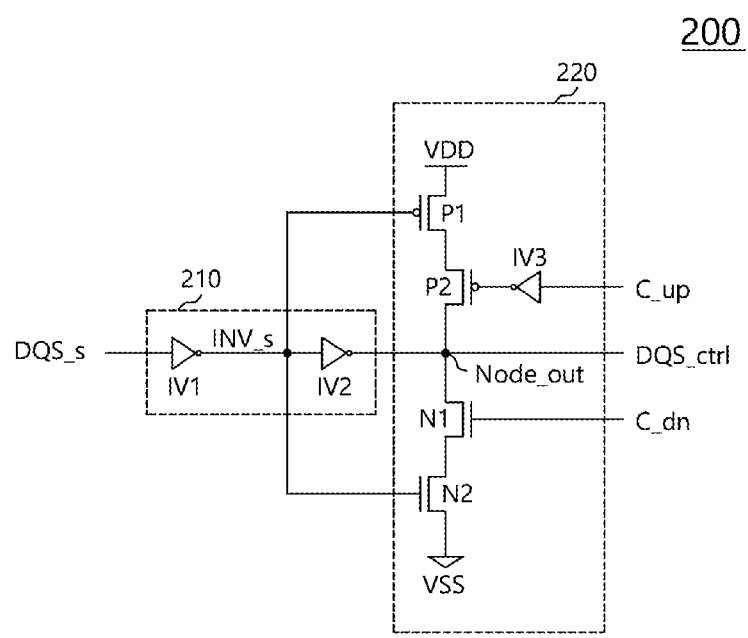
FIG. 3 is a diagram illustrating an example of the strobe signal control circuit shown in FIG. 1.

In FIG. 3, the strobe signal control circuit 200 may include a driving circuit 210 and a slew rate control circuit 220.

The driving circuit 210 may drive the strobe signal DQS_s and generate the control strobe signal DQS_ctrl. For example, the driving circuit 210 may generate an inverted signal INV_s by inverting the strobe signal DQS_s, and output the control strobe signal DQS_ctrl by inverting the inverted signal INV_s.

The driving circuit 210 may include first and second inverters IV1 and IV2.

The first inverter IV1 may invert the strobe signal DQS_s and generate the inverted signal INV_s.

The second inverter IV2 may invert the inverted signal INV_s and output the control strobe signal DQS_ctrl. An output node Node_out is coupled to the second inverter IV2, and the control strobe signal DQS_ctrl is outputted from the output node Node_out.

The slew rate control circuit 220 may shift one of the rising-edge and the falling-edge of the control strobe signal DQS_ctrl to an earlier point in time in response to the inverted signal INV_s, the up control signal C_up and the down control signal C_dn. For example, the slew rate control circuit 220 may pull up the control strobe signal DQS_ctrl in response to the inverted signal INV_s when the up control signal C_up is enabled. The slew rate control circuit 220 may pull down the control strobe signal DQS_ctrl in response to the inverted signal INV_s when the down control signal C_dn is enabled. In detail, the slew rate control circuit 220 may shift the rising-edge of the control strobe signal DQS_ctrl to an earlier point in time by pulling up the control strobe signal DQS_ctrl in response to the inverted signal INV_s that is at a first level (e.g., a low level) and in response to the up control signal C_up that is enabled. That is to say, the slew rate control circuit 220 may increase the slew rate of the control strobe signal DQS_ctrl at its rising edge by pulling up the control strobe signal DQS_ctrl in response to the inverted signal INV_s that is at the low level and in response to the up control signal C_up that is enabled. The slew rate control circuit 220 may shift the falling-edge of the control strobe signal DQS_ctrl to an earlier point in time by pulling down the control strobe signal DQS_ctrl in response to the inverted signal INV_s that is at a second level (e.g., a high level) and in response to the down control signal C_dn that is enabled. That is to say, the slew rate control circuit 220 may increase the slew rate of the control strobe signal DQS_ctrl at its falling edge by pulling down the control strobe signal DQS_ctrl in response to the inverted signal INV_s that is at the high level and in response to the down control signal C_dn that is enabled.

The slew rate control circuit 220 may include first to fourth transistors P1, P2, N1 and N2 and a third inverter IV3.

The first transistor P1 has a gate that is inputted with the inverted signal INV_s and a source that is applied with an external voltage VDD. The third inverter IV3 is inputted with the up control signal C_up. The second transistor P2 has a gate that is inputted with the output signal of the third inverter IV3, and a source coupled to the drain of the first transistor P1. The third transistor N1 has a gate that is inputted with the down control signal C_dn, and a drain coupled to the drain of the second transistor P2. The fourth transistor N2 has a gate that is inputted with the inverted signal INV_s, a drain coupled to the source of the third transistor N1, and a source that is applied with a ground voltage VSS. A node where the second and third transistors P2 and N1 are coupled serves as the output node Node_out, and the control strobe signal DQS_ctrl is outputted from the output node Node_out.

The semiconductor apparatus in accordance with an embodiment may operate as follows.

The noise determination circuit 100 may enable the up control signal C_up when a voltage level of the reference voltage Vref is higher than the voltage level of the first determination voltage Vref_DH. The noise determination circuit 100 may enable the down control signal C_dn when a voltage level of the reference voltage Vref is lower than the voltage level of the second determination voltage Vref_DL.

The strobe signal control circuit 200 may output the control strobe signal DQS_ctrl by shifting one of the rising-edge and the falling-edge of the strobe signal DQS_s to an earlier point in time in response to the up control signal C_up and the down control signal C_dn. For example, by performing an additional pull-up operation at the rising-edge of the strobe signal DQS_s when the up control signal C_up is enabled, the strobe signal control circuit 200 may shift the rising-edge of the strobe signal DQS_s to an earlier point in time and output the control strobe signal DQS_ctrl accordingly. In detail, by performing an additional pull-up operation at the rising-edge of the strobe signal DQS_s when the up control signal C_up is enabled, the strobe signal control circuit 200 may increase the slew rate of the strobe signal DQS_s at its rising edge and output the control strobe signal DQS_ctrl accordingly. In addition, by performing an additional pull-down operation at the falling-edge of the strobe signal DQS_s when the down control signal C_dn is enabled, the strobe signal control circuit 200 may shift the falling-edge of the strobe signal DQS_s to an earlier point in time and output the control strobe signal DQS_ctrl accordingly. In detail, by performing an additional pull-down operation at the falling-edge of the strobe signal DQS_s when the down control signal C_dn is enabled, the strobe signal control circuit 200 may increase the slew rate of the strobe signal DQS_s at its falling edge and output the control strobe signal DQS_ctrl accordingly.

The reception circuit 300 may compare the external data signal Data_ext with a voltage level of the reference voltage Vref each time the control strobe signal DQS_ctrl is enabled, and generate the internal data signal Data_int. As discussed above, the strobe signal control circuit 200 may output the control strobe signal DQS_ctrl generated by shifting one of the rising-edge and the falling-edge of the strobe signal DQS_s to an earlier point in time, the reception circuit 300 may compare the external data signal Data_ext with a voltage level of the reference voltage Vref based on the control strobe signal DQS_ctrl generated by shifting one of the rising-edge and the falling-edge of the strobe signal DQS_s to an earlier point in time and generate the internal data signal Data_int.

In this way, the semiconductor apparatus in accordance with an embodiment may minimize kickback noise cause by changes in the voltage level of the reference voltage Vref, for example, when the duty of the strobe signal DQS_s is distorted, by generating the control strobe signal DQS_ctrl based on the strobe signal DQS_s the duty of which has been corrected, and may generate the internal data signal Data_int by determining the external data signal Data_ext in response to the control strobe signal DQS_ctrl.

Figure 4:
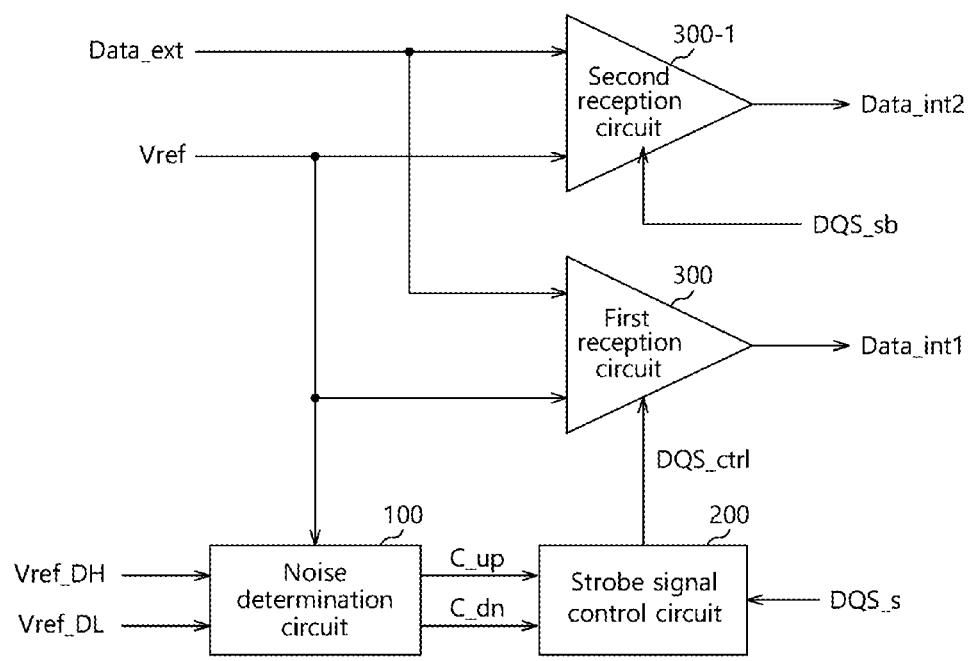
FIG. 4 is a diagram illustrating an example of a semiconductor apparatus in accordance with an embodiment.

In FIG. 4, a semiconductor apparatus in accordance with an embodiment may include a noise determination circuit 100, a strobe signal control circuit 200, a first reception circuit 300, and a second reception circuit 300-1.

The noise determination circuit 100 may sense and determine noise of a reference voltage Vref, and generate an up control signal C_up and a down control signal C_dn. For example, the noise determination circuit 100 may enable one of the up control signal C_up and the down control signal C_dn when a voltage level of the reference voltage Vref is equal to or higher than a predetermined voltage level or when a voltage level of the reference voltage Vref is equal to or lower than the predetermined voltage level. For example, the noise determination circuit 100 may enable the up control signal C_up when the reference voltage Vref is equal to or higher than the voltage level of a first determination voltage Vref_DH. The noise determination circuit 100 may enable the down control signal C_dn when the reference voltage Vref is equal to or lower than the voltage level of a second determination voltage Vref_DL. The first determination voltage Vref_DH has the voltage level higher than the voltage level of the reference voltage Vref, and the second determination voltage Vref_DL has the voltage level lower than the voltage level of the reference voltage Vref.

The strobe signal control circuit 200 may adjust one of a rising-edge timing and a falling-edge timing of a strobe signal DQS_s in response to the up control signal C_up and the down control signal C_dn, and output a control strobe signal DQS_ctrl. For example, the strobe signal control circuit 200 may adjust the rising-edge timing of the strobe signal DQS_s when the up control signal C_up is enabled, and output the control strobe signal DQS_ctrl accordingly. The strobe signal control circuit 200 may adjust the falling-edge timing of the strobe signal DQS_s when the down control signal C_dn is enabled, and output the control strobe signal DQS_ctrl accordingly. In detail, the strobe signal control circuit 200 may shift a rising-edge of the strobe signal DQS_s to an earlier point in time when the up control signal C_up is enabled. For example, the strobe signal control circuit 200 may increase a slew rate of the strobe signal DQS_s at its rising edge. The strobe signal control circuit 200 may shift a falling-edge of the strobe signal DQS_s to an earlier point in time when the down control signal C_dn is enabled. For example, the strobe signal control circuit 200 may increase a slew rate of the strobe signal DQS_s at its falling edge.

The first reception circuit 300 may generate first internal data signal Data_int1 in response to the control strobe signal DQS_ctrl and external data signal Data_ext. For example, the first reception circuit 300 may generate the first internal data signal Data_int1 by comparing the external data signal Data_ext with a voltage level of the reference voltage Vref during a period when the control strobe signal DQS_ctrl is enabled.

The second reception circuit 300-1 may generate second internal data signal Data_int2 in response to a strobe bar signal DQS_sb and the external data signal Data_ext. For example, the second reception circuit 300-1 may generate the second internal data signal Data_int2 by comparing the external data signal Data_ext with a voltage level of the reference voltage Vref during a period when the strobe bar signal DQS_sb is enabled. The strobe bar signal DQS_sb may be a signal with a phase opposite to the strobe signal DQS_s.

The noise determination circuit 100 may include first and second comparison circuits 110 and 120 as illustrated in FIG. 2, and the operations and configurations of the first and second comparison circuits 110 and 120 may be the same as described above with reference to FIG. 2.

The strobe signal control circuit 200 may include a driving circuit 210 and a slew rate control circuit 220 as illustrated in FIG. 3, and the operations and configurations of the driving circuit 210 and the slew rate control circuit 220 may be the same as described above with reference to FIG. 3.

The operation of the semiconductor apparatus in accordance with an embodiment will be described below.

The noise determination circuit 100 may disable the up control signal C_up and the down control signal C_dn when a voltage level of the reference voltage Vref is within a predetermined voltage level range. The noise determination circuit 100 may enable one of the up control signal C_up and the down control signal C_dn if a voltage level of the reference voltage Vref is not within the predetermined voltage level range. For example, the noise determination circuit 100 may enable the up control signal C_up when a voltage level of the reference voltage Vref is higher than the voltage level of the first determination voltage Vref_DH. The noise determination circuit 100 may disable the up control signal C_up when a voltage level of the reference voltage Vref is lower than the voltage level of the first determination voltage Vref_DH. The noise determination circuit 100 may enable the down control signal C_dn when a voltage level of the reference voltage Vref is lower than the voltage level of the second determination voltage Vref_DL. The noise determination circuit 100 may disable the down control signal C_dn when a voltage level of the reference voltage Vref is higher than the voltage level of the second determination voltage Vref_DL. The first determination voltage Vref_DH is higher than the voltage level of the reference voltage Vref, and the second determination voltage Vref_DL is lower than the voltage level of the reference voltage Vref. Therefore, the noise determination circuit 100 may disable both the up control signal C_up and the down control signal C_dn when a voltage level of the reference voltage Vref is between the first determination voltage Vref_DH and the second determination voltage Vref_DL. The noise determination circuit 100 may enable the up control signal C_up when a voltage level of the reference voltage Vref is higher than the voltage level of the first determination voltage Vref_DH, and may enable the down control signal C_dn when a voltage level of the reference voltage Vref is lower than the voltage level of the second determination voltage Vref_DL.

The strobe signal control circuit 200 may output the strobe signal DQS_s, as the control strobe signal DQS_ctrl, when both the up control signal C_up and the down control signal C_dn are disabled. The strobe signal control circuit 200 may shift the rising-edge timing of the strobe signal DQS_s to an earlier point in time when the up control signal C_up is enabled, and may output the control strobe signal DQS_ctrl accordingly. The strobe signal control circuit 200 may shift the falling-edge timing of the strobe signal DQS_s to an earlier point in time when the down control signal C_dn is enabled, and may output the control strobe signal DQS_ctrl accordingly.

The first reception circuit 300 may compare the external data signal Data_ext with the reference voltage Vref each time the control strobe signal DQS_ctrl is enabled, and generates the first internal data signal Data_int1.

The second reception circuit 300-1 may compare the external data signal Data_ext with the reference voltage Vref each time the strobe bar signal DQS_sb is enabled, and may generate the second internal data signal Data_int2.

The strobe signal DQS_s and the strobe bar signal DQS_sb are signals having opposite phases. Thus, the rising-edge timing of the strobe signal DQS_s is the same as the falling-edge timing of the strobe bar signal DQS_sb, and the falling-edge timing of the strobe signal DQS_s is the same as the rising-edge timing of the strobe bar signal DQS_sb.

Noise may arise in a voltage signal of the reference voltage Vref when there is a mismatch between the transition timings of the strobe signal DQS_s and the strobe bar signal DQS_sb. That is to say, noise may occur in the reference voltage Vref when the rising-edge timing of the strobe signal DQS_s and the falling-edge timing of the strobe bar signal DQS_sb do not synchronizes with each other or when the falling-edge timing of the strobe signal DQS_s and the rising-edge timing of the strobe bar signal DQS_sb do not synchronizes with each other.

As a consequence, the semiconductor apparatus in accordance with an embodiment may determine a mismatch between the transition timings of a strobe signal and a strobe bar signal by sensing noise of a reference voltage, and may shift the transition timings of the strobe signal and the strobe bar signal so that a rising edge of one signal synchronizes with a falling edge of the other signal by shifting the rising-edge timing or the falling-edge timing of one signal (e.g., the strobe signal). If the transition timings of a control strobe signal and the strobe bar signal being inputted to reception circuits synchronize with each other, noise of the reference voltage may be reduced, and the reception circuits which operate by being applied with the reference voltage may generate internal data signal in response to external data signal without errors or with minimal errors.

Figure 5:
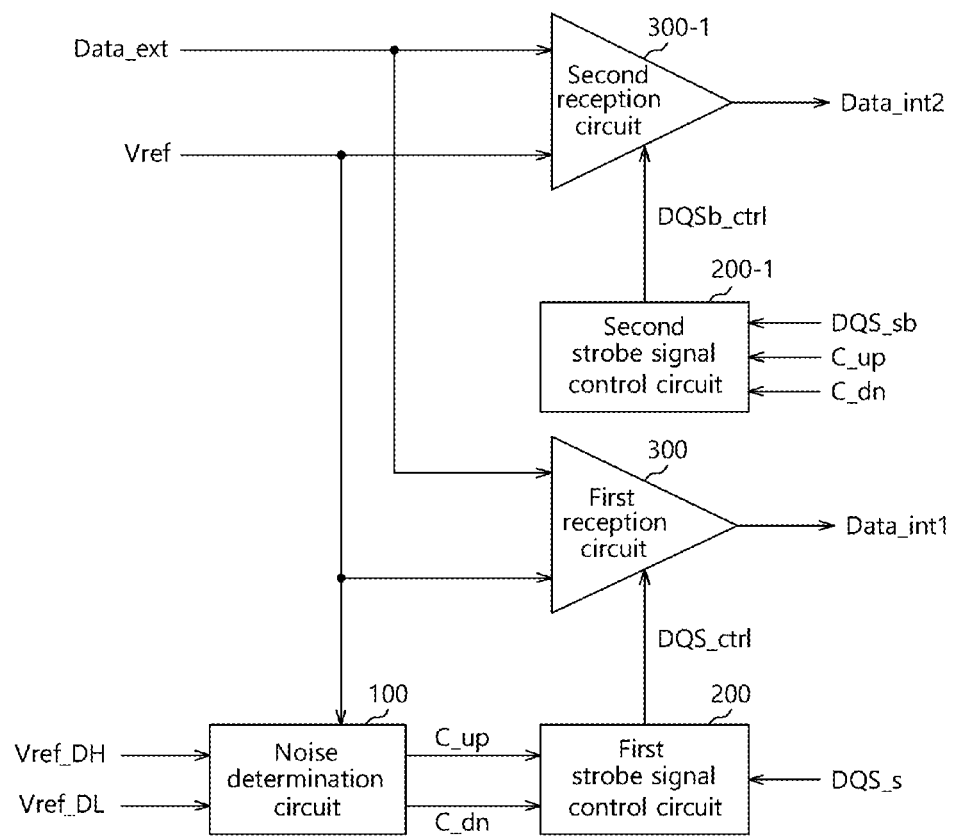
FIG. 5 is a diagram illustrating an example of a semiconductor apparatus in accordance with an embodiment.

In FIG. 5, a semiconductor apparatus in accordance with an embodiment may include a noise determination circuit 100, a first strobe signal control circuit 200, a second strobe signal control circuit 200-1, a first reception circuit 300, and a second reception circuit 300-1.

The noise determination circuit 100 may sense and determine noise of a reference voltage Vref, and generate an up control signal C_up and a down control signal C_dn. For example, the noise determination circuit 100 may enable one of the up control signal C_up and the down control signal C_dn when a voltage level of the reference voltage Vref is equal to or higher than a predetermined voltage level or when a voltage level of the reference voltage Vref is equal to or lower than the predetermined voltage level. For example, the noise determination circuit 100 may enable the up control signal C_up when the reference voltage Vref is equal to or higher than the voltage level of a first determination voltage Vref_DH. The noise determination circuit 100 may enable the down control signal C_dn when the reference voltage Vref is equal to or lower than the voltage level of a second determination voltage Vref_DL. The first determination voltage Vref_DH has the voltage level higher than the voltage level of the reference voltage Vref, and the second determination voltage Vref_DL has the voltage level lower than the voltage level of the reference voltage Vref.

The first strobe signal control circuit 200 may adjust one of the rising-edge timing and the falling-edge timing of a strobe signal DQS_s in response to the up control signal C_up and the down control signal C_dn, and output a control strobe signal DQS_ctrl. For example, the first strobe signal control circuit 200 may adjust the rising-edge timing of the strobe signal DQS_s when the up control signal C_up is enabled, and output the control strobe signal DQS_ctrl accordingly. The first strobe signal control circuit 200 may shift the falling-edge timing of the strobe signal DQS_s when the down control signal C_dn is enabled, and output the control strobe signal DQS_ctrl accordingly. In detail, the first strobe signal control circuit 200 may shift the rising-edge timing of the strobe signal DQS_s to an earlier point in time when the up control signal C_up is enabled. For example, the first strobe signal control circuit 200 may increase a slew rate of the strobe signal DQS_s at its rising edge. The first strobe signal control circuit 200 may shift the falling-edge timing of the strobe signal DQS_s to an earlier point in time when the down control signal C_dn is enabled. For example, the first strobe signal control circuit 200 may increase a slew rate of the strobe signal DQS_s at its falling edge.

The second strobe signal control circuit 200-1 may adjust one of the rising-edge timing and the falling-edge timing of a strobe bar signal DQS_sb in response to the up control signal C_up and the down control signal C_dn, and output a control strobe bar signal DQSb_ctrl. For example, the second strobe signal control circuit 200-1 may adjust the rising-edge timing of the strobe bar signal DQS_sb when the up control signal C_up is enabled, and output the control strobe bar signal DQSb_ctrl accordingly. The second strobe signal control circuit 200-1 may adjust the falling-edge timing of the strobe bar signal DQS_sb when the down control signal C_dn is enabled, and output the control strobe bar signal DQSb_ctrl accordingly. In detail, the second strobe signal control circuit 200-1 may shift the rising-edge timing of the strobe bar signal DQS_sb to an earlier point in time when the up control signal C_up is enabled. For example, the second strobe signal control circuit 200-1 may increase a slew rate of the strobe bar signal DQS_sb at its rising edge. The second strobe signal control circuit 200-1 may shift the falling-edge timing of the strobe bar signal DQS_sb to an earlier point in time when the down control signal C_dn is enabled. For example, the second strobe signal control circuit 200-1 may increase a slew rate of the strobe bar signal DQS_sb at its falling edge.

The second strobe signal control circuit 200-1 may adjust the falling-edge timing of the strobe bar signal DQS_sb when the up control signal C_up is enabled, and output the control strobe bar signal DQSb_ctrl accordingly. The second strobe signal control circuit 200-1 may adjust the rising-edge timing of the strobe bar signal DQS_sb when the down control signal C_dn is enabled, and output the control strobe bar signal DQSb_ctrl accordingly. In detail, the second strobe signal control circuit 200-1 may shift the falling-edge timing of the strobe bar signal DQS_sb to an earlier point in time when the up control signal C_up is enabled. For example, the second strobe signal control circuit 200-1 may increase a slew rate of the strobe bar signal DQS_sb at its falling edge. The second strobe signal control circuit 200-1 may shift the rising-edge timing of the strobe bar signal DQS_sb to an earlier point in time when the down control signal C_dn is enabled. For example, the second strobe signal control circuit 200-1 may increase a slew rate of the strobe bar signal DQS_sb at its rising edge. The strobe bar signal DQS_sb may be a signal having a phase opposite to the strobe signal DQS_s.

The first reception circuit 300 may generate first internal data signal Data_int1 in response to the control strobe signal DQS_ctrl and external data signal Data_ext. For example, the first reception circuit 300 may generate the first internal data signal Data_int1 by comparing the external data signal Data_ext with a voltage level of the reference voltage Vref during a period when the control strobe signal DQS_ctrl is enabled.

The second reception circuit 300-1 may generate second internal data signal Data_int2 in response to the control strobe bar signal DQSb_ctrl and the external data signal Data_ext. For example, the second reception circuit 300-1 may generate the second internal data signal Data_int2 by comparing the external data signal Data_ext with a voltage level of the reference voltage Vref during a period when the control strobe bar signal DQSb_ctrl is enabled.

The noise determination circuit 100 may include first and second comparison circuits 110 and 120 as illustrated in FIG. 2, and the operations and configurations of the first and second comparison circuits 110 and 120 may be the same as described above with reference to FIG. 2.

Each of the first and second strobe signal control circuits 200 and 200-1 may include a driving circuit 210 and a slew rate control circuit 220 as illustrated in FIG. 3, and the operations and configurations of the driving circuit 210 and the slew rate control circuit 220 included in each of the first and second strobe signal control circuits 200 and 200-1 may be the same as described above with reference to FIG. 3. One (e.g., the second strobe signal control circuit 200-1) of the first and second strobe signal control circuits 200 and 200-1 may be configured such that the falling-edge timing of the strobe bar signal DQS_sb (or the strobe signal DQS_s) is adjusted when the up control signal C_up is enabled and the rising-edge timing of the strobe bar signal DQS_sb (or the strobe signal DQS_s) is adjusted when the down control signal C_dn is enabled, unlike the other (e.g., the first strobe signal control circuit 200).

The operation of the semiconductor apparatus in accordance with an embodiment will be described below.

The noise determination circuit 100 may disable the up control signal C_up and the down control signal C_dn when a voltage level of the reference voltage Vref is within a predetermined voltage level range. The noise determination circuit 100 may enable one of the up control signal C_up and the down control signal C_dn in the case where a voltage level of the reference voltage Vref is not within the predetermined voltage level range. For example, the noise determination circuit 100 may enable the up control signal C_up when a voltage level of the reference voltage Vref is higher than the voltage level of the first determination voltage Vref_DH. The noise determination circuit 100 may disable the up control signal C_up when a voltage level of the reference voltage Vref is lower than the voltage level of the first determination voltage Vref_DH. The noise determination circuit 100 enables the down control signal C_dn when a voltage level of the reference voltage Vref is lower than the voltage level of the second determination voltage Vref_DL. The noise determination circuit 100 disables the down control signal C_dn when a voltage level of the reference voltage Vref is higher than the voltage level of the second determination voltage Vref_DL. The first determination voltage Vref_DH is higher than the voltage level of the reference voltage Vref, and the second determination voltage Vref_DL is lower than the voltage level of the reference voltage Vref. Therefore, the noise determination circuit 100 may disable both the up control signal C_up and the down control signal C_dn when a voltage level of the reference voltage Vref is between the first determination voltage Vref_DH and the second determination voltage Vref_DL. The noise determination circuit 100 may enable the up control signal C_up when a voltage level of the reference voltage Vref is higher than the voltage level of the first determination voltage Vref_DH, and may enable the down control signal C_dn when a voltage level of the reference voltage Vref is lower than the voltage level of the second determination voltage Vref_DL.

The first strobe signal control circuit 200 may output the strobe signal DQS_s, as the control strobe signal DQS_ctrl, when both the up control signal C_up and the down control signal C_dn are disabled. The first strobe signal control circuit 200 may shift the rising-edge timing of the strobe signal DQS_s to an earlier point in time when the up control signal C_up is enabled, and may output the control strobe signal DQS_ctrl accordingly. The first strobe signal control circuit 200 may shift the falling-edge timing of the strobe signal DQS_s to an earlier point in time when the down control signal C_dn is enabled, and may output the control strobe signal DQS_ctrl accordingly.

The second strobe signal control circuit 200-1 may output the strobe bar signal DQS_sb, as the control strobe bar signal DQSb_ctrl, when both the up control signal C_up and the down control signal C_dn are disabled. The second strobe signal control circuit 200-1 may shift the rising-edge timing of the strobe bar signal DQS_sb to an earlier point in time when the up control signal C_up is enabled, and may output the control strobe bar signal DQSb_ctrl accordingly. The second strobe signal control circuit 200-1 may shift the falling-edge timing of the strobe bar signal DQS_sb to an earlier point in time when the down control signal C_dn is enabled, and may output the control strobe bar signal DQSb_ctrl accordingly.

The second strobe signal control circuit 200-1 may adjust the falling-edge timing of the strobe bar signal DQS_sb when the up control signal C_up is enabled, and output the control strobe bar signal DQSb_ctrl accordingly. The second strobe signal control circuit 200-1 may adjust the rising-edge timing of the strobe bar signal DQS_sb when the down control signal C_dn is enabled, and output the control strobe bar signal DQSb_ctrl accordingly.

The first reception circuit 300 may compare the external data signal Data_ext with the reference voltage Vref each time the control strobe signal DQS_ctrl is enabled, and may generate the first internal data signal Data_int1.

The second reception circuit 300-1 may compare the external data signal Data_ext with the reference voltage Vref each time the control strobe bar signal DQSb_ctrl is enabled, and may generate the second internal data signal Data_int2.

The strobe signal DQS_s and the strobe bar signal DQS_sb are signals having opposite phases. Thus, the rising-edge timing of the strobe signal DQS_s may be the same timing as the falling-edge timing of the strobe bar signal DQS_sb, and the falling-edge timing of the strobe signal DQS_s may be the same timing as the rising-edge timing of the strobe bar signal DQS_sb.

Noise may arise in a voltage signal of the reference voltage Vref when there is a mismatch between the transition timings of the strobe signal DQS_s and the strobe bar signal DQS_sb. That is to say, noise may occur in the reference voltage Vref when the rising-edge timing of the strobe signal DQS_s and the falling-edge timing of the strobe bar signal DQS_sb do not synchronizes with each other or when the falling-edge timing of the strobe signal DQS_s and the rising-edge timing of the strobe bar signal DQS_sb do not synchronizes with each other.

As a consequence, the semiconductor apparatus in accordance with an embodiment may determine a mismatch between the transition timings of a strobe signal and a strobe bar signal by sensing noise of a reference voltage, and may shift the transition timings of a control strobe signal and a control strobe bar signal so that a rising edge of one signal synchronizes with a falling edge of the other signal by shifting the rising-edge timings or the falling-edge timings of the respective strobe signal and strobe bar signal. If the transition timings of the control strobe signal and the control strobe bar signal being inputted to reception circuits synchronize with each other, noise of the reference voltage may be reduced, and the reception circuits which operate by being applied with the reference voltage may generate internal data signal in response to external data signal without errors or with minimal errors.

While various embodiments have been described above, it will be understood to those skilled in the art that the embodiments described are examples only. Accordingly, the semiconductor apparatus described herein should not be limited based on the described embodiments.

What is claimed is:

1. A semiconductor apparatus comprising:
    a noise determination circuit configured to sense and determine noise of a reference voltage, and generate an up control signal and a down control signal;
    a strobe signal control circuit configured to adjust a transition timing of a strobe signal in response to the up control signal and the down control signal, and output a control strobe signal; and
    a reception circuit configured to generate internal data signal in response to external data signal, the reference voltage, and the control strobe signal.

2. The semiconductor apparatus according to claim 1, wherein the noise determination circuit disables both the up control signal and the down control signal when a voltage level change in the reference voltage falls within a predetermined voltage level range, and enables one of the up control signal and the down control signal when a voltage level change in the reference voltage falls outside the predetermined voltage level range.

3. The semiconductor apparatus according to claim 2, wherein the noise determination circuit enables the up control signal when a voltage level of the reference voltage is higher than a highest voltage level of the predetermined voltage level range, and enables the down control signal when a voltage level of the reference voltage is lower than a lowest voltage level of the predetermined voltage level range.

4. The semiconductor apparatus according to claim 3, wherein the noise determination circuit comprises:
    a first comparison circuit configured to compare the reference voltage and a voltage level of a first determination voltage, and generate the up control signal; and
    a second comparison circuit configured to compare the reference voltage and a voltage level of a second determination voltage, and generate the down control signal,
    wherein the first determination voltage corresponds to the highest voltage level of the predetermined voltage level range, and the second determination voltage corresponds to the lowest voltage level of the predetermined voltage level range.

5. The semiconductor apparatus according to claim 1, wherein the strobe signal control circuit outputs the control strobe signal by shifting a rising-edge timing of the strobe signal in response to the up control signal or outputs the control strobe signal by shifting a falling-edge timing of the strobe signal in response to the down control signal.

6. The semiconductor apparatus according to claim 5, wherein the strobe signal control circuit comprises:
    a driving circuit configured to generate an inverted signal by being inputted with the strobe signal, and output the control strobe signal by inverting the inverted signal; and
    a slew rate control circuit configured to pull up the control strobe signal in response to the inverted signal when the up control signal is enabled or pull down the control strobe signal in response to the inverted signal when the down control signal is enabled.

7. The semiconductor apparatus according to claim 1, wherein the reception circuit generates the internal data signal by comparing the external data signal with the reference voltage each time the control strobe signal is enabled.

8. A semiconductor apparatus comprising:
    a noise determination circuit configured to generate an up control signal and a down control signal in response to a reference voltage, a first determination voltage, and a second determination voltage;
    a strobe signal control circuit configured to adjust a transition timing of a strobe signal in response to the up control signal and the down control signal, and output a control strobe signal;
    a first reception circuit configured to compare external data signal with a voltage level of the reference voltage when the control strobe signal is enabled, and generate first internal data signal; and
    a second reception circuit configured to compare the external data signal with a voltage level of the reference voltage when a strobe bar signal is enabled, and generate second internal data signal.

9. The semiconductor apparatus according to claim 8, wherein a voltage level of the first determination voltage is higher than a voltage level of the second determination voltage, and the strobe signal and the strobe bar signal are signals having opposite phases.

10. The semiconductor apparatus according to claim 9, wherein the noise determination circuit enables the up control signal when a voltage level of the reference voltage is higher than the first determination voltage, and enables the down control signal when a voltage level of the reference voltage is lower than the second determination voltage.

11. The semiconductor apparatus according to claim 10, wherein the noise determination circuit comprises:
 a first comparison circuit configured to generate the up control signal in response to the reference voltage and the first determination voltage; and
 a second comparison circuit configured to generate the down control signal in response to the reference voltage and the second determination voltage.

12. The semiconductor apparatus according to claim 8, wherein the strobe signal control circuit outputs the strobe signal as the control strobe signal when both the up control signal and the down control signal are disabled, and shifts one of a rising-edge timing and a falling-edge timing of the strobe signal when one of the up control signal and the down control signal is enabled.

13. The semiconductor apparatus according to claim 12, wherein the strobe signal control circuit shifts the rising-edge timing of the strobe signal to an earlier point in time when the up control signal is enabled, and shifts the falling-edge timing of the strobe signal to an earlier point in time when the down control signal is enabled.

14. A semiconductor apparatus comprising:
 a noise determination circuit configured to disable both an up control signal and a down control signal or enable one of the up control signal and the down control signal based on whether a voltage level change in a reference voltage is between a first determination voltage and a second determination voltage or the voltage level change in the reference voltage is equal to or higher than the first determination voltage or equal to or lower than the second determination voltage;
 a first strobe signal control circuit configured to output a strobe signal, as a control strobe signal, in response to the up control signal and the down control signal;
 a second strobe signal control circuit configured to output a strobe bar signal, as a control strobe bar signal, in response to the up control signal and the down control signal;
 a first reception circuit configured to compare external data signal with a voltage level of the reference voltage in response to the control strobe signal, and generate first internal data signal; and
 a second reception circuit configured to compare the external data signal with a voltage level of the reference voltage in response to the control strobe bar signal, and generate second internal data signal.

15. The semiconductor apparatus according to claim 14, wherein the noise determination circuit disables both the up control signal and the down control signal if a voltage level change of the reference voltage is between the first determination voltage and the second determination voltage, enables the up control signal if a voltage level change of the reference voltage is equal to or higher than a voltage level of the first determination voltage, and enables the down control signal if a voltage level change of the reference voltage is equal to or lower than a voltage level of the second determination voltage.

16. The semiconductor apparatus according to claim 14,
 wherein the first strobe signal control circuit adjusts a transition timing of the strobe signal in response to the up control signal and the down control signal, and outputs the control strobe signal, and
 wherein the second strobe signal control circuit adjusts a transition timing of the strobe bar signal in response to the up control signal and the down control signal, and outputs the control strobe bar signal.

17. The semiconductor apparatus according to claim 16, wherein the first strobe signal control circuit adjusts a rising-edge timing of the strobe signal when the up control signal is enabled, and adjusts a falling-edge timing of the strobe signal when the down control signal is enabled.

18. The semiconductor apparatus according to claim 16, wherein the second strobe signal control circuit adjusts a rising-edge timing of the strobe bar signal when the up control signal is enabled, and adjusts a falling-edge timing of the strobe bar signal when the down control signal is enabled.

19. The semiconductor apparatus according to claim 16, wherein the second strobe signal control circuit adjusts a falling-edge timing of the strobe bar signal when the up control signal is enabled, and adjusts a rising-edge timing of the strobe bar signal when the down control signal is enabled.

* * * * *